United States Patent
Shubin et al.

(10) Patent No.: US 9,829,626 B2
(45) Date of Patent: Nov. 28, 2017

(54) HYBRID-INTEGRATED MULTI-CHIP MODULE

(71) Applicant: Oracle International Corporation, Redwood Shores, CA (US)

(72) Inventors: Ivan Shubin, San Diego, CA (US); Xuezhe Zheng, San Diego, CA (US); Jin Hyoung Lee, San Diego, CA (US); Ashok V. Krishnamoorthy, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 67 days.

(21) Appl. No.: 14/994,976

(22) Filed: Jan. 13, 2016

(65) Prior Publication Data
US 2017/0199328 A1  Jul. 13, 2017

(51) Int. Cl.
G02B 6/122 (2006.01)
G02B 6/42 (2006.01)
H01S 5/022 (2006.01)
G02B 6/12 (2006.01)

(52) U.S. Cl.
CPC ........... G02B 6/122 (2013.01); G02B 6/1228 (2013.01); G02B 6/428 (2013.01); H01S 5/0228 (2013.01); G02B 2006/12121 (2013.01); G02B 2006/12147 (2013.01)

(58) Field of Classification Search
CPC .............................. G02B 6/12002; G02B 6/428
See application file for complete search history.

(56) References Cited

U.S. PATENT DOCUMENTS

| 6,821,802 B2* | 11/2004 | Ahn ................... G02B 6/4201 257/E25.032 |
| 7,035,509 B2 | 4/2006 | Payne |
| 9,488,777 B2 | 11/2016 | Lee et al. |
| 2005/0041902 A1 | 2/2005 | Frigo |
| 2015/0055912 A1 | 2/2015 | Kachru |

(Continued)

OTHER PUBLICATIONS

Shoji et al: "Low loss mode size converter from 0.3 um square Si wire waveguides to singlemode fiberes" Electronics Letter, Dec. 5, 2002, vol. 38, No. 25.

(Continued)

*Primary Examiner* — Omar R Rojas
(74) *Attorney, Agent, or Firm* — Park, Vaughan, Fleming & Dowler LLP

(57) ABSTRACT

A multi-chip module (MCM) is described. This MCM includes a driver integrated circuit that includes electrical circuits, a photonic chip, an interposer, and an optical gain chip. The photonic chip may be implemented using a silicon-on-insulator technology, and may include an optical waveguide that conveys an optical signal and traces that are electrically coupled to the driver integrated circuit. Moreover, the interposer may be electrically coupled to the traces. Furthermore, the optical gain chip may include a III/V compound semiconductor (and, more generally, a semiconductor other than silicon), and may include a second optical waveguide that conveys the optical signal and that is vertically aligned with the optical waveguide relative to a top surface of the interposer. Additionally, the optical gain chip may be electrically coupled to the interposer.

20 Claims, 13 Drawing Sheets

(56) References Cited

U.S. PATENT DOCUMENTS

2016/0291265 A1\* 10/2016 Kinghorn ............... G02B 6/131
2017/0047312 A1\* 2/2017 Budd ................... G02B 6/4204

OTHER PUBLICATIONS

Lee et al.: "High power and widely tunable Si hybrid external-cavity laser for power efficient Si photonics WDM links", received Jan. 3, 2014, revised Mar. 13, 2014, accepted Mar. 14, 2014; published Mar. 25, 2014, Apr. 7, 2014, vol. 22, No. 7, DOI:10,1364/OE.22.007678, Optics Express 7678.

Zilkie et al.: "Power-efficient III-V/Silicon external cavity DBR lasers", Received Jul. 30, 2012, revised Sep. 19, 2012, accepted Sep. 19, 2012, published Sep. 27, 2012, Oct. 8, 2012, vol. 20. No. 21, Optic Express 23456.

\* cited by examiner

HYBRID-INTEGRATED MULTI-CHIP MODULE

U.S. GOVERNMENT LICENSE RIGHTS

This invention was made with U.S. Government support under Agreement No. HR0011-08-9-0001 awarded by DARPA. The U.S. Government has certain rights in the invention.

BACKGROUND

Field

The present disclosure generally relates to multi-chip modules (MCMs) and techniques for fabricating MCMs. More specifically, the present disclosure relates to an MCM that includes a photonic chip, an interposer and an optical gain chip.

Related Art

Optical interconnects based on silicon-photonics technology have the potential to outperform electrical interconnects in terms of bandwidth, component density, energy efficiency, latency, and physical reach. Consequently, optical interconnects are a promising solution to alleviate inter-chip and intra-chip communication bottlenecks in high-performance computing systems.

While tremendous progress has been made in developing silicon-on-insulator (SOI) circuits, light sources on silicon remain a substantial technological challenge. In particular, in order to make an efficient laser source on silicon, an efficient optical gain medium is needed. However, because of its indirect bandgap structure, silicon is usually a poor material for light emission. Although there are ongoing efforts to enhance the light-emitting efficiency and optical gain in silicon, an electrically pumped room-temperature continuous-wave (CW) laser in silicon remains elusive. Similarly, while there have been exciting developments in the use of germanium directly grown on silicon as the optical gain medium, high-tensile strain and high doping are typically needed to make germanium have a direct bandgap, which usually results in low laser efficiency. Furthermore, epitaxial growth of III/V compound semiconductors on silicon is often difficult because of the large lattice and thermal mismatches between silicon and the III/V compound semiconductors, which also limits laser efficiency and reliability. Thus, because of a number of material, process and device physics issues, these areas remain research topics.

An alternative near-term approach for building lasers on or using silicon is hybrid wafer integration of III/V compound semiconductors with silicon. For example, evanescent-coupled hybrid lasers have been successfully demonstrated by wafer bonding of indium-phosphide active structures to silicon via either oxide-to-oxide fusion bonding or polymer-enabled benzocyclobutene bonding. However, because of taper loss, carrier-injection efficiency and thermal impedance, these hybrid lasers typically have relatively low optical-waveguide-coupled overall efficiency. Furthermore, wafer-bonding approaches usually only work for direct bonding of III/V compound semiconductors on a silicon wafer with passive circuits. In addition, III/V compound-semiconductor wafers and SOI wafers often do not have compatible sizes. In particular, a III/V compound-semiconductor wafer size is usually limited to 150 mm, while typical SOI photonic wafer diameters are 200 mm and 300 mm. Consequently, integrating hybrid laser sources with other active silicon devices (which may include multiple layers of metal interconnects and interlayer dielectrics) remains a challenge.

Edge-to-edge butt-coupling of a III/V compound-semiconductor optical gain medium with silicon optical waveguides is a common hybrid integration approach. It allows the high electrical injection efficiency and low thermal impedance of conventional III/V compound-semiconductor lasers to be maintained. Moreover, using this approach, both the III/V compound-semiconductor optical gain media and the SOI circuits can be independently optimized for performance, and can be independently fabricated. External cavity (EC) lasers using this hybrid integration technique have been successfully demonstrated with high optical-waveguide-coupled overall efficiencies. However, because of the optical-mode mismatch between the III/V compound-semiconductor and the silicon optical waveguides, special mode size converters on either or both sides of the III/V compound semiconductor and silicon are often needed. In addition, in order to obtain efficient optical coupling, accurate alignment of the optical waveguides in the III/V compound semiconductor and the silicon with sub-micron alignment tolerances is typically needed. Addressing these problems can decrease the yield and increase the cost of these hybrid lasers.

Hence, what is needed is a multi-chip module (MCM) and a technique for fabricating an MCM without the problems described above.

SUMMARY

One embodiment of the present disclosure provides a multi-chip module (MCM). This MCM includes a driver integrated circuit having a top surface, where the driver integrated circuit includes electrical circuits. Moreover, the MCM includes a photonic chip, which includes: a substrate; a buried-oxide (BOX) layer disposed on the substrate; and a semiconductor layer, where an optical waveguide is defined in the BOX layer and the semiconductor layer, and traces disposed on the semiconductor layer face and are electrically coupled to the top surface of the driver integrated circuit. Furthermore, the MCM includes an interposer having a top surface, where the top surface of the interposer faces and is electrically coupled to the traces. Additionally, the MCM includes an optical gain chip, where the optical gain chip includes a second substrate and a second optical waveguide is defined in the second substrate. Note that the second optical waveguide is vertically aligned with the optical waveguide relative to the top surface of the interposer, and the second substrate faces and is electrically coupled to the top surface of the interposer.

In some embodiments, the MCM includes a spacer disposed on the top surface of the interposer so that the second optical waveguide is vertically aligned with the optical waveguide. For example, the spacer may include: a metal, a polymer and/or a resin.

Moreover, the optical gain chip may include an optical spot-size converter that, during operation, transitions a spot size of an optical mode in the optical waveguide to a second spot size of a second optical mode in the second optical waveguide. Alternatively or additionally, the photonic chip may include an optical spot-size converter that, during operation, transitions a spot size of an optical mode in the optical waveguide to a second spot size of a second optical mode in the second optical waveguide.

Note that the second semiconductor may be a semiconductor other than silicon. For example, the second semiconductor may include a III/V compound semiconductor.

Moreover, the optical gain chip may be a semiconductor optical amplifier and/or a laser.

Furthermore, the substrate, the BOX layer and the semiconductor layer may constitute a silicon-on-insulator technology.

Additionally, the photonic chip may include an optical fiber coupler, which can optically couple to an optical fiber. In some embodiments, the MCM includes the optical fiber optically coupled to the optical fiber coupler.

Another embodiment provides a system that includes: a processor; a memory, coupled to the processor, which stores a program module, and which, during operation, is executed by the processor; and the MCM.

Another embodiment provides a method for outputting an optical signal. During the method, a driver integrated circuit in an MCM provides an electrical signal to a photonic chip in the MCM, where a top surface of the photonic integrated circuit faces and is electrically coupled to a trace disposed on a semiconductor layer in the photonic chip. Moreover, the photonic chip includes a substrate, a BOX layer disposed on the substrate, and the semiconductor layer disposed on the BOX layer, and an optical waveguide is defined in the BOX layer and the semiconductor layer. Then, a trace in the photonic chip conveys the electrical signal, and the photonic chip provides the electrical signal to an interposer in the MCM, where a top surface of the interposer faces and is electrically coupled to the trace. Furthermore, the interposer conveys the electrical signal.

Next, the interposer provides the electrical signal to an optical gain chip in the MCM, where the optical gain chip includes a second substrate that faces and is electrically coupled to the top surface of the interposer. Additionally, the optical gain chip generates the optical signal based on the electrical signal, and a second optical waveguide defined in the second substrate conveys the optical signal. Moreover, the second optical waveguide optically couples the optical signal to the optical waveguide, which is vertically aligned with the second optical waveguide relative to the top surface of the interposer, and an optical fiber that is optically coupled to the optical waveguide outputs the optical signal.

This Summary is provided merely for purposes of illustrating some exemplary embodiments, so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

Note that like reference numerals refer to corresponding parts throughout the drawings. Moreover, multiple instances of the same type of part are designated by a common prefix separated from an instance number by a dash.

DETAILED DESCRIPTION

Figure 1:
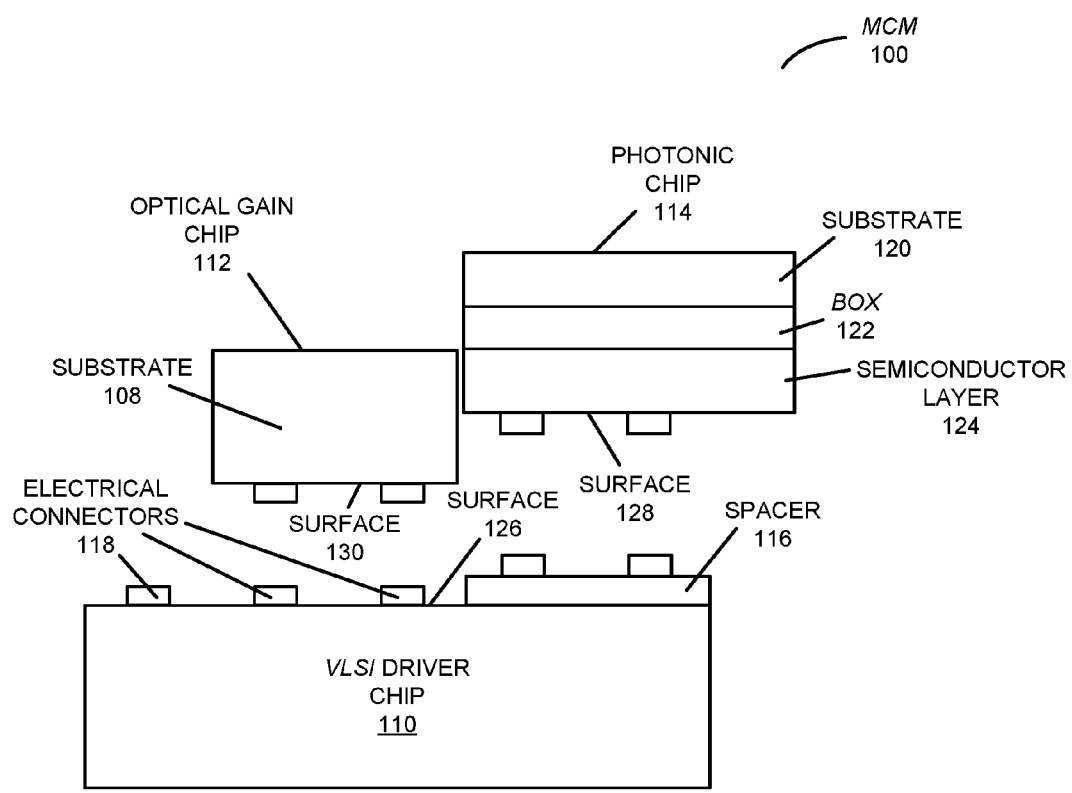
FIG. 1 is a diagram illustrating a side view of fabrication of a multi-chip module (MCM) in accordance with an embodiment of the present disclosure.

Embodiments of a multi-chip module (MCM), a system that includes the MCM, and a technique for outputting an optical signal using the MCM are described. This MCM includes a driver integrated circuit that includes electrical circuits, a photonic chip, an interposer, and an optical gain chip. The photonic chip may be implemented using a silicon-on-insulator (SOI) technology, and may include an optical waveguide that conveys an optical signal and traces that are electrically coupled to the driver integrated circuit. Moreover, the interposer may be electrically coupled to the traces. Furthermore, the optical gain chip may include a III/V compound semiconductor (and, more generally, a semiconductor other than silicon), and may include a second optical waveguide that conveys the optical signal and that is vertically aligned with the optical waveguide relative to a top surface of the interposer. Additionally, the optical gain chip may be electrically coupled to the interposer.

In this way, the MCM may provide low-cost co-planar integration of the optical gain chip and the photonic chip (or wafer) using edge coupling to form a co-planar hybrid platform. The MCM may provide internal light generation and photonic on-chip processing by permanent active substrates, and it may be enabled by high-precision flip-chip bonding systems (e.g., with $\Delta x$, $\Delta y$ equal to $\pm 0.5$ μm). Moreover, the MCM may provide fully functional light-emitting optical transceivers that: are compact, have low power consumption, operate at high bandwidth, and are scalable into large-array systems and links. Consequently, the MCM may enable high efficiency and performance of chip-to-chip and board-to-board optical interconnects.

We now describe embodiments of an MCM. Low-loss edge coupling of III/V compound-semiconductor optical waveguides with silicon or silicon-on-insulator (SOI) optical waveguides usually involves: optical mode matching, a high-surface quality coupling edge, and accurate optical waveguide alignment. A typical III/V compound-semiconductor optical waveguide has an optical mode size around 1 μm in diameter vertically, which matches neither one of the two popular SOI platforms for silicon photonics, 0.25 to 0.3 μm SOI and 3 μm SOI. Spot-size converters (SSCs) are usually needed on the side with a smaller optical mode size to up-convert the optical mode size to match the other side with the larger optical mode size. In order to integrate a III/V compound-semiconductor active gain medium with a 0.25 to 0.3 μm SOI platform, SSCs are, therefore, typically needed on the SOI side. Moreover, in order to expand the optical mode both laterally and vertically, an SSC using an inverse silicon optical waveguide taper followed with a larger dielectric optical waveguide with a lower index-of-refraction contrast may be used. Furthermore, in order to obtain coupling edges with good surface quality, cleaving or dicing and polishing are often used, which forces integration to be performed on a chip-by-chip basis.

As discussed in "Back-Side Etching and Cleaving of Substrates," by Jin Hyoung Lee, Ivan Shubin, Xuezhe Zheng, and Ashok V. Krishnamoorthy, U.S. patent application Ser. No. 14/024,227, filed on Sep. 11, 2013, having the contents of which are herein incorporated by reference, backside-etch assisted cleaving can create a high-quality coupling edge on SOI without the need for polishing. This backside fabrication technique is also a wafer-scale process that allows multiple openings to be created in a single wafer. These openings can be accurately defined by backside photolithography and may be terminated at the SOI optical waveguide facets. The backside fabrication technique, as well as facet polishing and/or facet definition by highly anisotropic dry etching, may be used to fabricate high-quality optical waveguide facets that are used in the fabrication technique described below.

Moreover, III/V compound-semiconductor optical gain chips and their optical waveguides are typically cleaved in order to obtain optical access. This cleaving typically results in high-quality facets.

The MCM described herein may integrate three types of chips into a single functional, hybrid-integrated photonic module or transceiver with internally generated laser light (and, more generally, an optical signal). In particular, the MCM may include: a III/V compound-semiconductor optical gain chip or optical gain medium chip (such as an optical gain medium chip implemented on an indium phosphide substrate), an external laser cavity SOI photonic chip with or without light-modulating circuits on the silicon substrate, and a data-modulating and laser-driving VLSI chip on a silicon substrate. All three of these chips may be manufactured with different processing technologies, which may not be compatible with each other.

The disclosed embodiments of the MCM may be assembled using high-precision flip-chip bonding equipment by: passively aligning and securing the chips based on their alignment features on applicable interfaces or surfaces; and/or actively aligning chips to each other. For example, the chips may be aligned while the secured and electrically connected light source (e.g., the optical gain chip) is powered on, and adapting or changing the position of the SOI photonic chip to optimize the detected coupled light or optical signal. The flip-chip bonding equipment may align the optical waveguides in the chips with high and sufficient accuracy (such as ±0.5 μm) to ensure a uniform bondline with respect to the VLSI driver chip and/or the interposer. This may be accomplished by first bonding the optical gain chip to the electrically active interposer while ensuring electrical connectivity to the chips bonded to it. Then, the optical gain chip may be powered up via the interposer to generate the optical signal. Next, the SOI photonic chip may be brought into immediate edge contact (a so-called 'active edge' where light is either exiting or entering) with the edge of the optical gain chip and the optical signal is coupled into the optical waveguide(s) in the SOI photonic chip. Note that the SOI chip may have fixed or temporary electrical connectivity to allow the coupled light to be detected and measured externally, so that the position with the highest detected optical signal can be determined. In addition, note that the MCM may be fabricated using individual chips or in wafer-scale integration.

FIG. 1 presents a diagram illustrating a side view of fabrication of an MCM 100. This MCM includes an optical gain chip 112 and a photonic chip 114. For example, optical gain chip 112 may include a substrate 108 that includes a III/V compound-semiconductor and an optical waveguide. In an exemplary embodiment, optical gain chip 112 is a semiconductor optical amplifier and/or a laser. Furthermore, photonic chip 114 may be an SOI photonic chip. Therefore, photonic chip 114 may include: silicon substrate 120; a buried-oxide layer (BOX) 122 disposed on silicon substrate 120; and a semiconductor (silicon) layer 124 disposed on buried-oxide layer 122, where another optical waveguide is defined in semiconductor layer 124.

Moreover, optical gain chip 112 and photonic chip 114 may be disposed on a top surface 126 of a driver integrated circuit or a VLSI driver chip (or substrate) 110 (which functions as a permanent active interposer). This VLSI driver chip may include an optical-waveguide leveling spacer 116 (or spacer layer) and a matching set of electrical pads or connectors 118. For example, spacer 116 may include: a metal, a polymer and/or a resin.

Furthermore, optical gain chip 112 and photonic chip 114 may be electrically coupled to VLSI driver chip 100. For example, traces disposed on semiconductor layer 124 (i.e., on top surface 128) may face and may be electrically coupled to top surface 126 of VLSI driver chip 110. In addition, a surface 130 of optical gain chip 112 may be electrically coupled to top surface 126 of VLSI driver chip 110.

Note that spacer 116 may be located on one chip and/or the other in MCM 100 depending on the vertical positions of their optical modes and the fabrication technology used to fabricate components in MCM 100.

Figure 2:
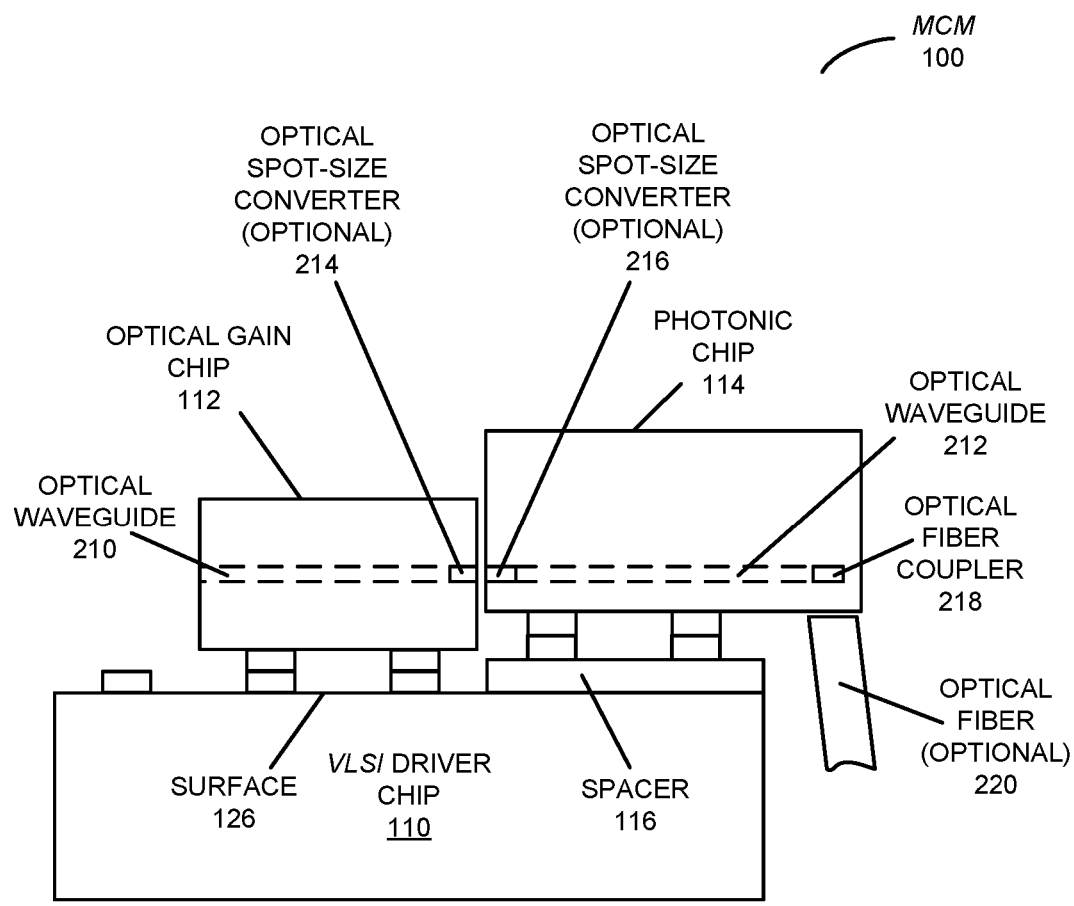
FIG. 2 is a diagram illustrating a side view of the MCM in FIG. 1 in accordance with an embodiment of the present disclosure.

FIG. 2 presents a diagram illustrating a side view of an MCM 100 after assembly. In FIG. 2, the matching set of electrical pads or connectors 118 (FIG. 1) may power up and provide data to the photonic chip 114, and may drive current through optical gain chip 112. Note that permanent adhesive (such as epoxy) may be used in order to secure the aligned assembly.

As noted previously, the MCM may be used to vertically align chips having different structures. In particular, optical waveguides in SOI and III/V compound-semiconductor chips may not be aligned vertically because of their vastly different fabrication techniques. FIG. 2 demonstrates schematically what two such different chips look like when their optical waveguides 210 and 212 are matched vertically for the best optical coupling. However, if the top surfaces of optical gain chip 112 and photonic chip 114 are not in the same plane, optical waveguides 210 and 212 may not be brought into complete six-axis alignment.

As shown in FIG. 2, by integrating one or more spacers (such as spacer 116) of appropriate thickness (equal to a difference between the heights or thicknesses of optical gain chip 112 and photonic chip 114) on surface 126, optical waveguides 210 and 212 may be aligned vertically by setting optical gain chip 112 and photonic chip 114 against a common interface or surface of VLSI driver chip 110. Note that the one or more spacers may include electrical pads on their top surfaces. Using the one or more spacers, the described chip-to-chip fabrication technique can be used to ensure self-alignment in all the degrees of freedom.

Moreover, MCM 100 may include optional optical spot-size converters 214 and/or 216. For example, optional optical spot-size converter 214 may, during operation, transition a spot size of an optical mode in optical waveguide 210 to a second spot size of a second optical mode in optical waveguide 212. Alternatively or additionally, optional optical spot-size converter 216 may, during operation, transition a spot size of the second optical mode in optical waveguide 212 to the spot size of the optical mode in optical waveguide 210. Furthermore, MCM 100 may have a portion of photonic chip 114 exposed in another post-processing operation in order to gain access to the optical input/output elements for optical coupling to optional optical fiber 220. In particular, photonic chip 114 in MCM 100 may include an optical fiber coupler 218 (such as a mirror or a diffraction grating), which may be optically coupled to input/output ports of photonic chip 114, and which may be optically coupled to optional optical fiber 220.

In some embodiments, assembly of an MCM is complicated by the need to use pre-tested parts (so-called 'known good die') in order to maximize the overall packaging yield. However, as the number of die increases in the MCM, the risk of failure grows accordingly. The optical module of the transceiver in the embodiments of the MCM includes optical gain chip 112 and photonic chip 114. In the embodiment shown in FIG. 2, this optical module can only be tested after all optical and electrical chips have been bonded together powering it all up. It may be advantageous to first build, test, and validate an optical component in the transceiver prior to committing this part to flip-chip assembly with its already-validated VLSI driver chip.

This capability is provided in another embodiment of the MCM. In particular, the MCM may include an extra carrier, and/or a mechanical and electrical interposer. This interposer may be a platform for optical gain chip 112 and photonic chip 114. Moreover, a passive interposer can be fabricated with somewhat relaxed fabrication tolerances (relative to VLSI and SOI processes) without active semiconductor elements. Furthermore, the interposer may provide: one or more spacers in order to vertically align optical waveguides 210 and 212; electrical interconnects matching those of optical gain chip 112 and photonic chip 114; mechanical strength; and/or additional options to thermally manage the optical module and to access a different plane with optical inputs and outputs.

Figure 3:
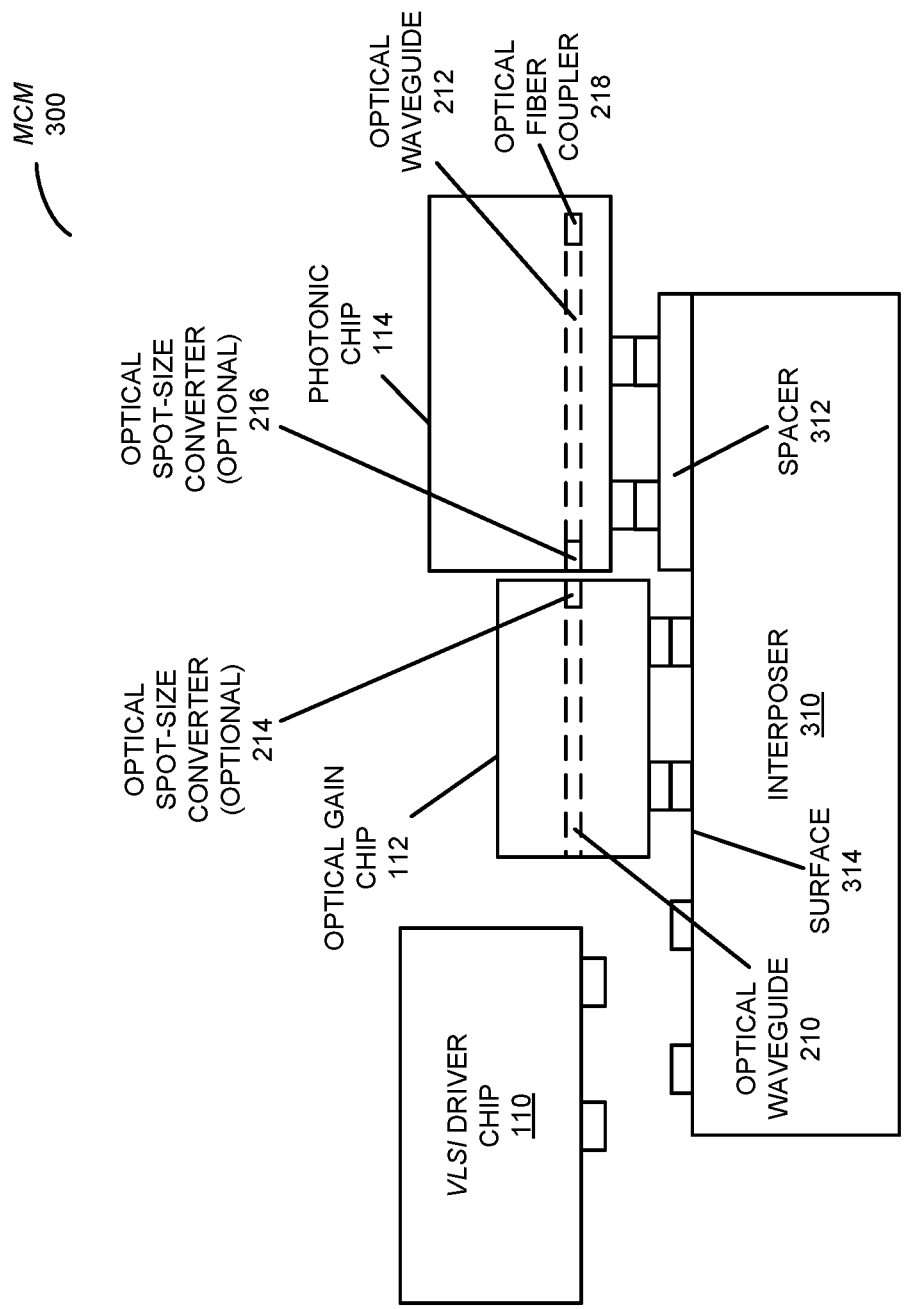
FIG. 3 is a flow diagram illustrating fabrication of an MCM in accordance with an embodiment of the present disclosure.

FIG. 3 presents a flow diagram illustrating fabrication of MCM 300. This MCM includes interposer 310 with one or more spacers (such as spacer 312) on top surface 314. Note that MCM 300 allows the optical module to be tested prior to assembly with VLSI driver chip 110 in the complete MCM, which is shown in FIG. 4.

Figure 5:
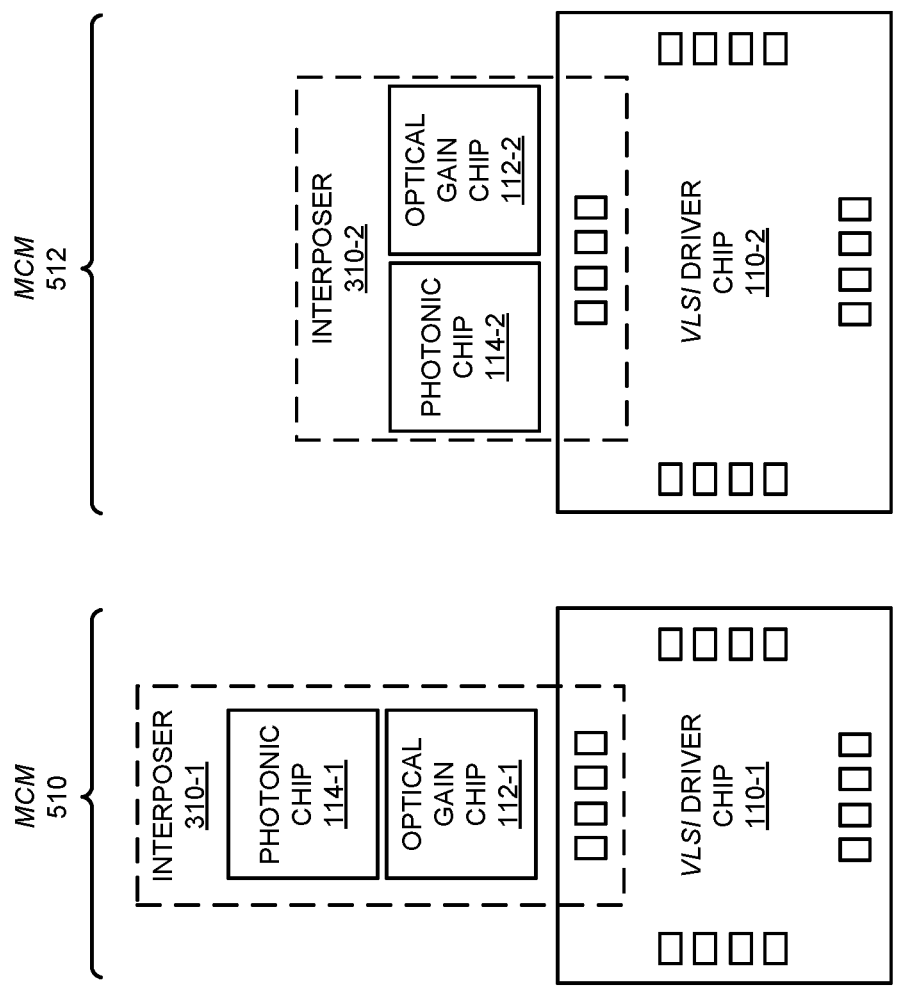
FIG. 5 is a diagram illustrating a top view of two MCMs in accordance with an embodiment of the present disclosure.

Depending on the eventual package dimensional, mechanical, thermal and electrical constraints, different chip arrangements may be used. Two arrangements are illustrated in FIG. 5, which presents a diagram illustrating a top view of MCMs 510 and 512.

Figure 4:
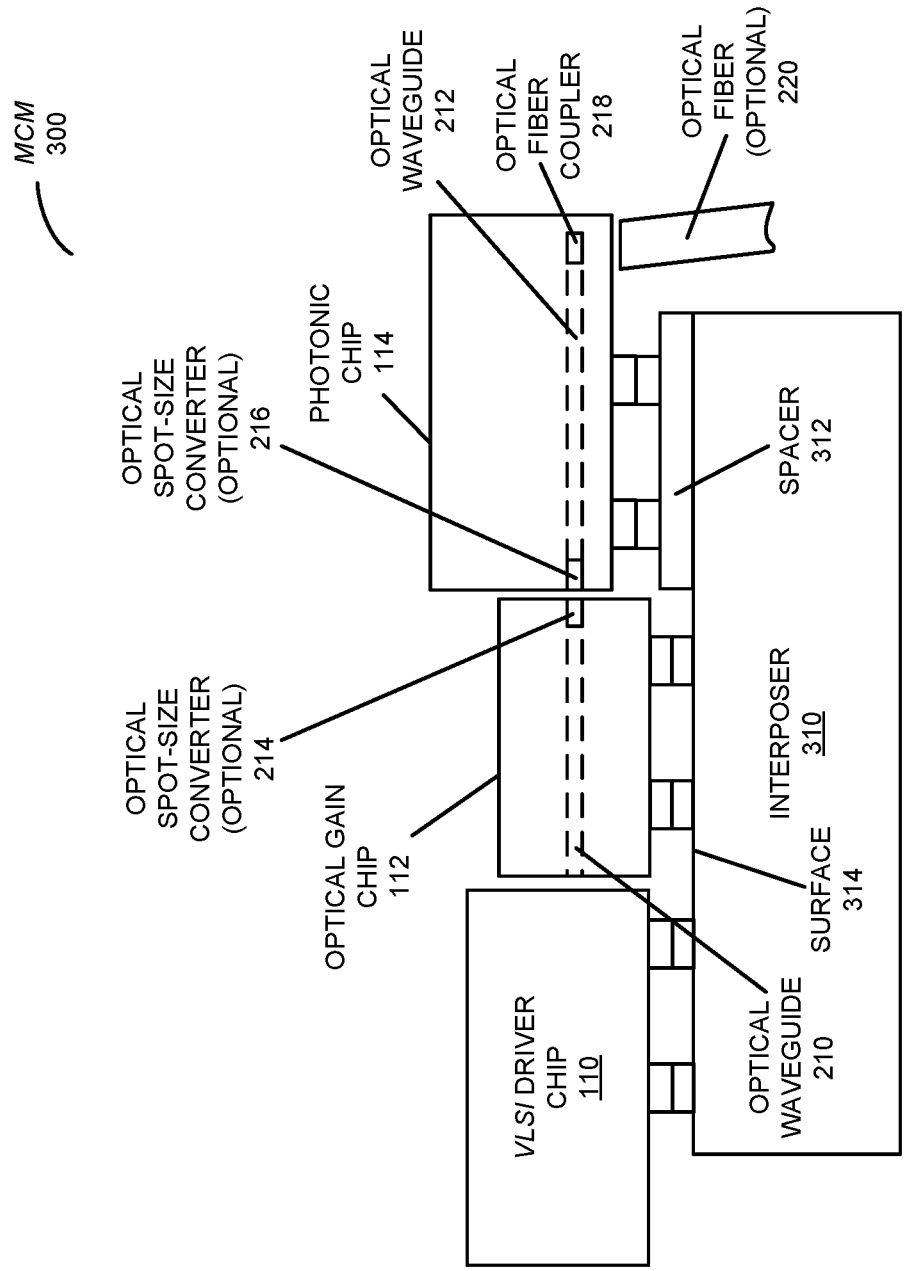
FIG. 4 is a flow diagram illustrating fabrication of the MCM in FIG. 3 in accordance with an embodiment of the present disclosure.
Figure 6:
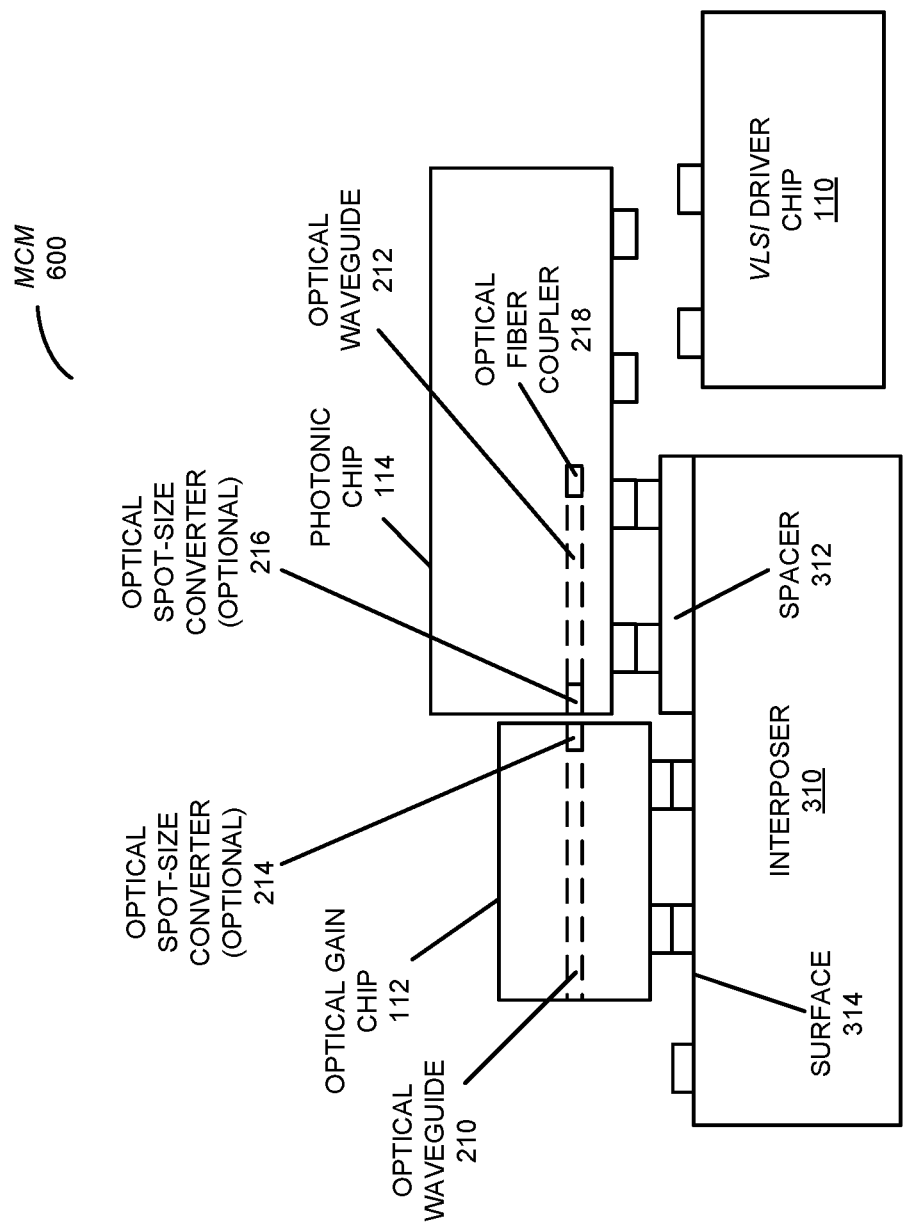
FIG. 6 is a flow diagram illustrating fabrication of an MCM in accordance with an embodiment of the present disclosure.
Figure 7:
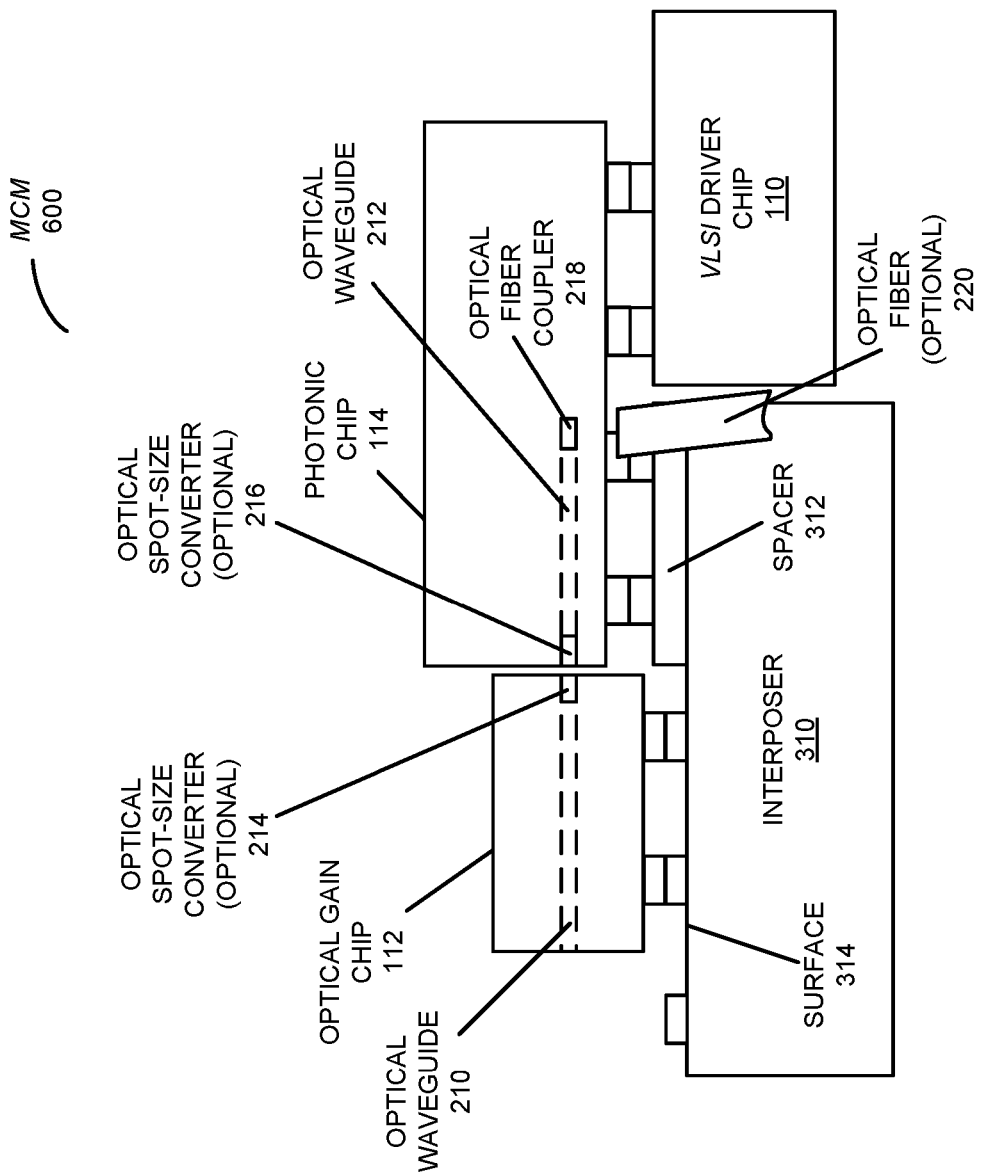
FIG. 7 is a diagram illustrating a side view of the MCM in FIG. 6 in accordance with an embodiment of the present disclosure.
Figure 8:
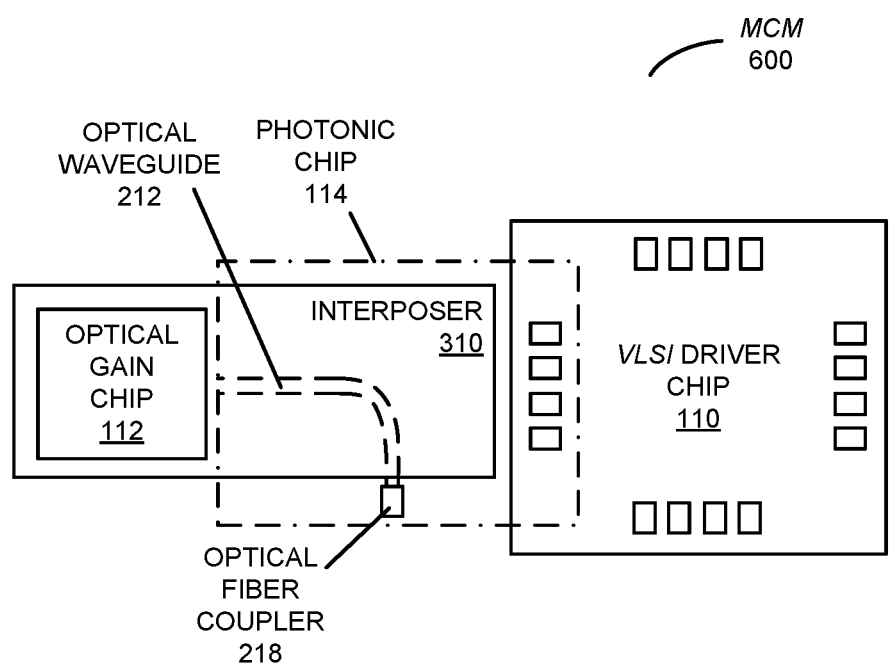
FIG. 8 is a diagram illustrating a top view of the MCM in FIG. 6 in accordance with an embodiment of the present disclosure.

In FIGS. 3 and 4, MCM 300 may use low-propagation-loss metal traces in interposer 310 to provide high-fidelity data signaling at low power to photonic chip 114. Alternatively, in some embodiments the electrical interconnection may be established directly from VLSI driver chip 114 to photonic chip 114. This is shown in FIGS. 6 and 7. In particular, FIG. 6 presents a flow diagram illustrating fabrication of an MCM 600. FIG. 7 presents a diagram illustrating a side view of the complete MCM and FIG. 8 presents a top view of the complete MCM.

Similar to the other embodiments of the MCM, MCM 600 uses optical gain chip 112 (as an optical amplifier or as a complete laser), which is coupled to photonic chip 114 with or without optional optical spot-size converter. Note that assembly may be carried out using accurate flip-chip bonding on to interposer 310. Once again, interposer 310 may include passive conducting traces to power up optical gain chip 112 from photonic chip 114. Moreover, the assembled optical module can be sufficiently tested before it is flip-chip attached to VLSI driver chip 110. Note that multiple optical channels can be simultaneously created by coupling arrays of optical outputs from optical gain chip 112 into arrays of (optical spot-size-converter enabled) inputs of photonic chip 114.

Figure 9:
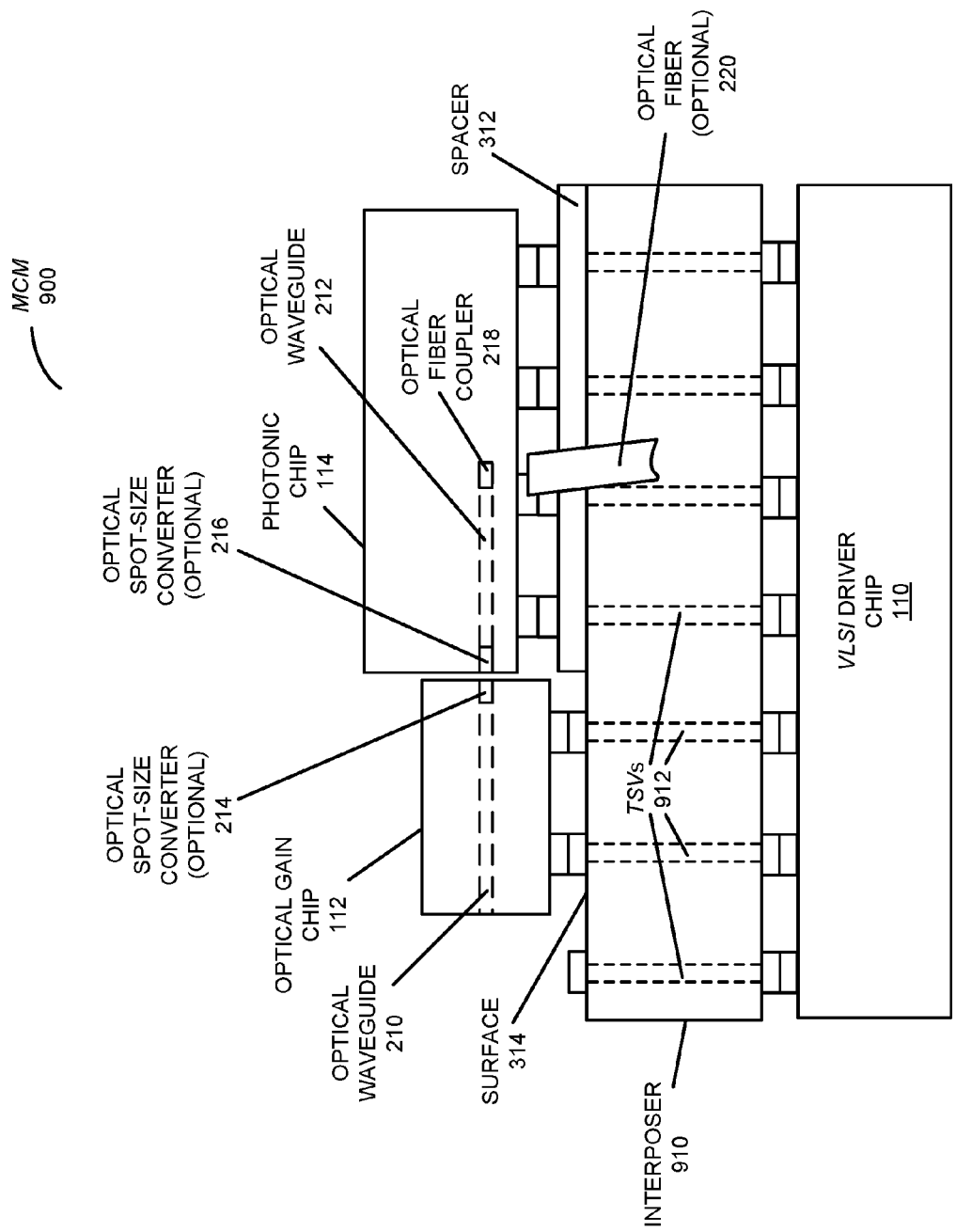
FIG. 9 is a diagram illustrating a side view of an MCM in accordance with an embodiment of the present disclosure.

In some embodiments, the interposer includes through-silicon vias. This is shown in FIG. 9, which presents a diagram illustrating a side view of an MCM 900. In particular, through-silicon vias (TSVs) 912 may be fabricated in silicon substrates by anisotropically etching vertical channels propagating from top to bottom. Typically, these channels may be isolated from each other by passivating their sidewalls with insulating dielectrics (such as silicon nitride and/or an oxide), while providing electrical conductivity by filling them with a metal (such as copper). Depending on the thickness of the interposer, TSVs 912 may range in length from several microns to hundreds of microns. Moreover, the diameter and pitch of TSVs 912 may be tightly and independently controlled. When appropriately designed, low-parasitic TSVs can be used both for power delivery and high-speed data transmission. Note that TSV-based packaging can substantially reduce the footprint of the MCM package, thereby decreasing power consumption.

As shown in FIG. 9, optical gain chip 112 and photonic chip 114 may be first bonded to interposer 910 with TSVs 912. Then, the optical module can be sufficiently tested before proceeding to attach it to VLSI driver chip 110. Note that MCM 900 may provide improved mechanical reliability.

Figure 10:
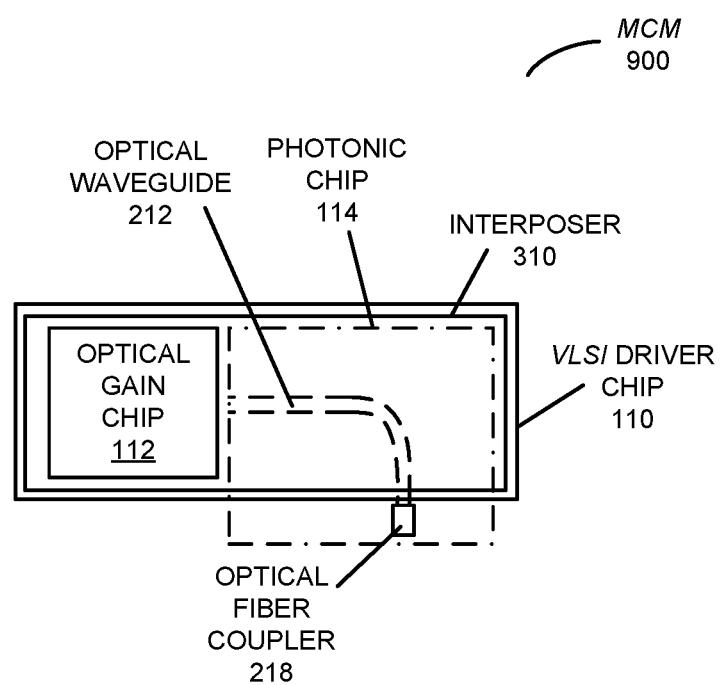
FIG. 10 is a diagram illustrating a top view of the MCM in FIG. 9 in accordance with an embodiment of the present disclosure.
Figure 11:
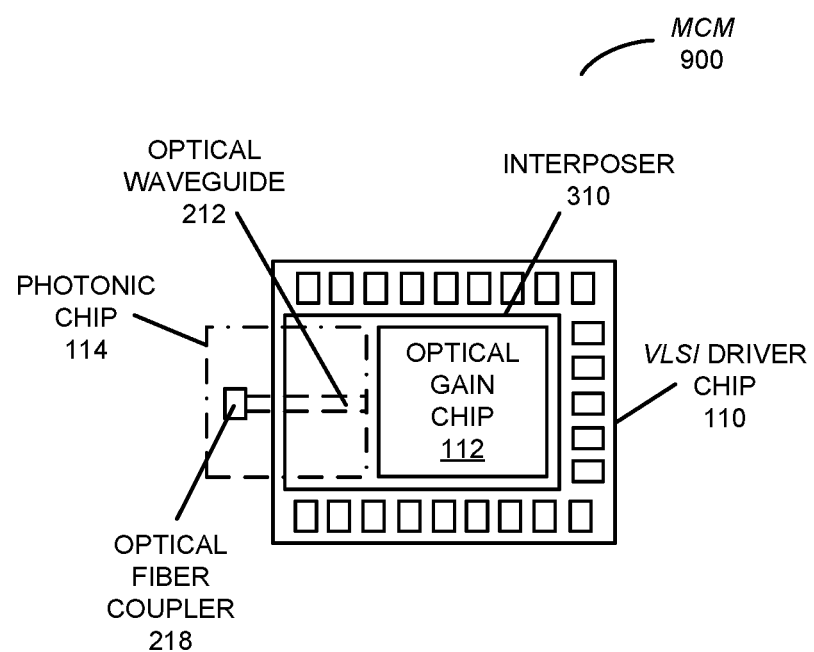
FIG. 11 is a diagram illustrating a top view of the MCM in FIG. 9 in accordance with an embodiment of the present disclosure.

Top views of different configurations of MCM 900 are shown in FIGS. 10 and 11.

Figure 12:
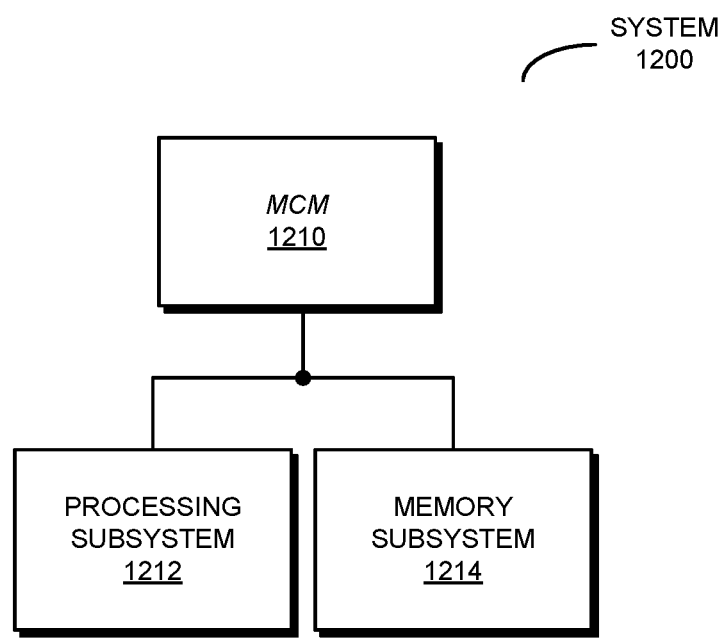
FIG. 12 is a block diagram illustrating a system in accordance with an embodiment of the present disclosure.

The MCM may be included in a system or an electronic device, such as a computer system. This is shown in FIG. 12, which presents a block diagram illustrating a system 1200 that includes MCM 1210. In some embodiments, system 1200 includes processing subsystem 1212 (with one or more processors) and memory subsystem 1214 (with memory).

In general, functions of MCM 1210 and system 1200 may be implemented in hardware and/or in software. Thus, system 1200 may include one or more program modules or sets of instructions stored in a memory subsystem 1214 (such as DRAM or another type of volatile or non-volatile computer-readable memory), which, during operation, may be executed by processing subsystem 1212. Note that the one or more computer programs may constitute a computer-program mechanism. Furthermore, instructions in the various modules in memory subsystem 1214 may be implemented in: a high-level procedural language, an object-oriented programming language, and/or in an assembly or machine language. Note that the programming language may be compiled or interpreted, e.g., configurable or configured, to be executed by the processing subsystem.

Components in system 1200 may be coupled by signal lines, links or buses. These connections may include electrical, optical, or electro-optical communication of signals and/or data. Furthermore, in the preceding embodiments, some components are shown directly connected to one another, while others are shown connected via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used.

In some embodiments, functionality in these circuits, components and devices may be implemented in one or more: application-specific integrated circuits (ASICs), field-programmable gate arrays (FPGAs), and/or one or more embodiments may be implemented more in hardware and less in software, or less in hardware and more in software, as is known in the art. In general, system 500 may be at one location or may be distributed over multiple, geographically dispersed locations.

System 1200 may include: a VLSI circuit, a switch, a hub, a bridge, a router, a communication system (such as a wavelength-division-multiplexing communication system), a storage area network, a data center, a network (such as a local area network), and/or a computer system (such as a multiple-core processor computer system). For example, the MCM may be included in a backplane that is coupled to multiple processor blades, or the MCM may couple different types of components (such as processors, memory, input/output devices, and/or peripheral devices). In some embodiments, the MCM performs the functions of: a switch, a hub, a bridge, and/or a router.

Note that the computer system may include, but is not limited to: a server (such as a multi-socket, multi-rack server), a laptop computer, a communication device or system, a personal computer, a work station, a mainframe computer, a blade, an enterprise computer, a data center, a supercomputer, a network-attached-storage (NAS) system, a storage-area-network (SAN) system, a media player (such as an MP3 player), an appliance, a subnotebook/netbook, a tablet computer, a smartwatch, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device. Note that a given computer system may be at one location or may be distributed over multiple, geographically dispersed locations.

Furthermore, the embodiments of MCM 1210 and/or system 1200 may include fewer components or additional components. Although these embodiments are illustrated as having a number of discrete items, these components are intended to be functional descriptions of the various features that may be present rather than structural schematics of the embodiments described herein. Consequently, in these embodiments two or more components may be combined into a single component, and/or a position of one or more components may be changed. In addition, functionality in the preceding embodiments of MCM 1210 and/or system 1200 may be implemented more in hardware and less in software, or less in hardware and more in software, as is known in the art.

In general, MCM 1210 may include an array of chip modules (CMs) or single-chip modules (SCMs), and a given SCM may include at least one substrate, such as a semiconductor die. Note that an MCM is sometimes referred to as a 'microchip.' Furthermore, the substrate may communicate with other substrates, CMs and/or SCMs in MCM 1210 using proximity communication of electromagnetically coupled signals (which is referred to as 'electromagnetic proximity communication'). For example, the proximity communication may include: communication of capacitively coupled signals ('electrical proximity communication') and/or communication of optical signals (such as 'optical proximity communication'). In some embodiments, the electromagnetic proximity communication includes inductively coupled signals and/or conductively coupled signals.

Note that components in MCM 1210 may be defined using an additive process (i.e., material deposition) and/or a subtractive process (i.e., material removal). For example, the process may include: sputtering, isotropic etching, anisotropic etching, a photolithographic technique and/or a direct-write technique. Additionally, these features may be fabricated using a wide variety of materials, including: a semiconductor, metal, glass, sapphire, silicon dioxide, organic materials, inorganic materials, a resin and/or polymers.

Figure 13:
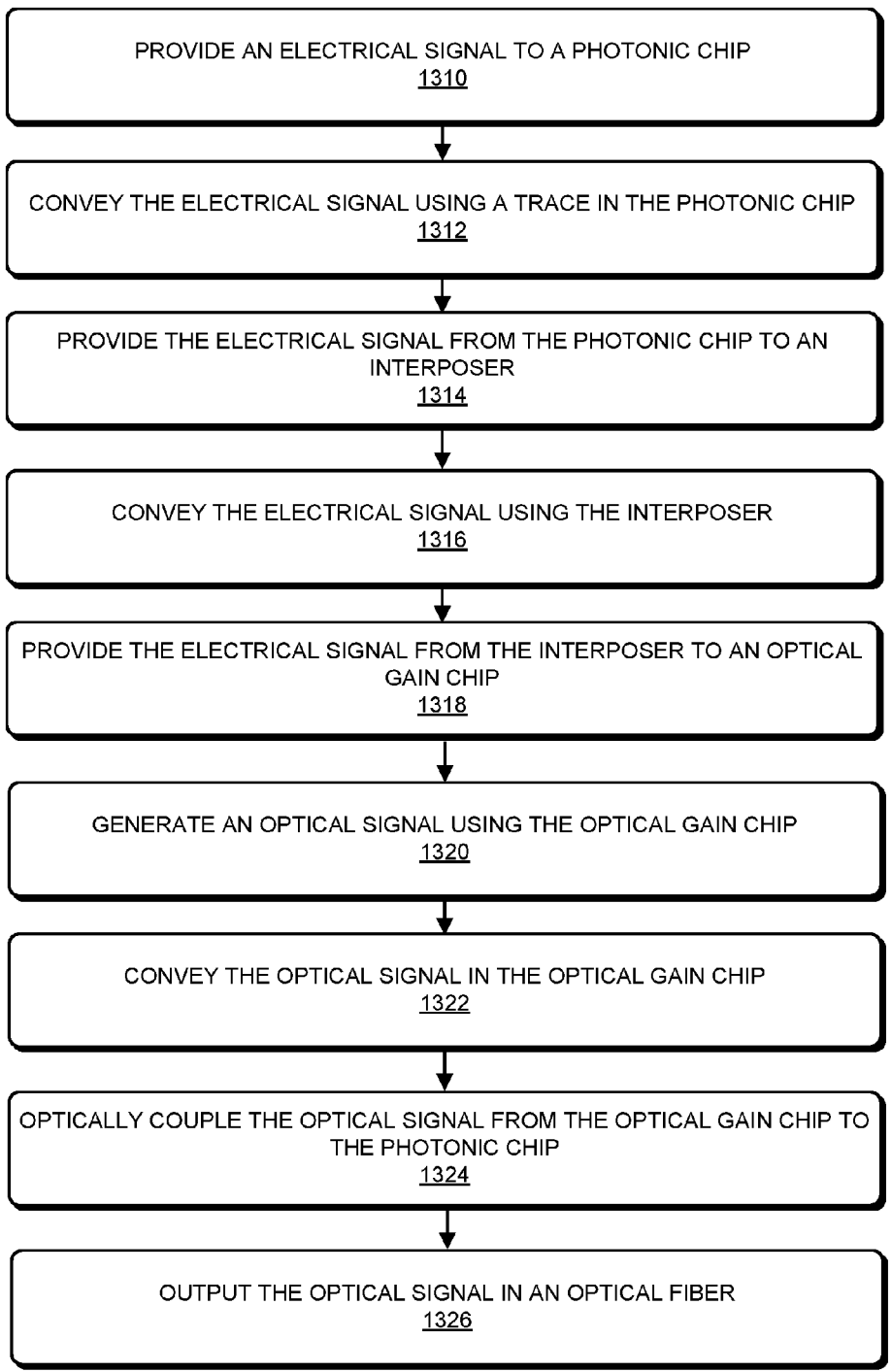
FIG. 13 is a flow chart illustrating a method for outputting an optical signal in accordance with an embodiment of the present disclosure.

We now describe embodiments of a method. FIG. 13 presents a flow chart illustrating a method 1300 for outputting an optical signal using an MCM, such as one of the preceding embodiments of the MCM. During this method, a driver integrated circuit in an MCM provides an electrical signal to a photonic chip (operation 1310) in the MCM, where a top surface of the photonic integrated circuit faces and is electrically coupled to a trace disposed on a semiconductor layer in the photonic chip. Moreover, the photonic chip includes a substrate, a BOX layer disposed on the substrate, and the semiconductor layer disposed on the BOX layer, and an optical waveguide is defined in the BOX layer and the semiconductor layer. Then, a trace in the photonic chip conveys the electrical signal (operation 1312), and the photonic chip provides the electrical signal to an interposer (operation 1314) in the MCM, where a top surface of the interposer faces and is electrically coupled to the trace. Furthermore, the interposer conveys the electrical signal (operation 1316).

Next, the interposer provides the electrical signal to an optical gain chip (operation 1318) in the MCM, where the optical gain chip includes a second substrate that faces and is electrically coupled to the top surface of the interposer. Additionally, the optical gain chip generates the optical signal (operation 1320) based on the electrical signal, and a second optical waveguide defined in the second substrate conveys the optical signal (operation 1322). Moreover, the second optical waveguide optically couples the optical signal (operation 1324) to the optical waveguide, which is vertically aligned with the second optical waveguide relative to the top surface of the interposer, and an optical fiber that is optically coupled to the optical waveguide outputs the optical signal (operation 1326).

In some embodiments of method 1300, there are additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A multi-chip module (MCM), comprising:
a driver integrated circuit having a top surface, wherein the driver integrated circuit includes electrical circuits;
a photonic chip, wherein the photonic chip includes:
  a substrate;
  a buried-oxide (BOX) layer disposed on the substrate; and
  a semiconductor layer, wherein an optical waveguide is defined in the BOX layer and the semiconductor layer, and
wherein traces disposed on the semiconductor layer face and are electrically coupled to the top surface of the driver integrated circuit;
an interposer having a top surface, wherein the top surface of the interposer faces and is electrically coupled to the traces; and
an optical gain chip, wherein the optical gain chip includes a second substrate,
wherein a second optical waveguide is defined in the second substrate,
wherein the second optical waveguide is vertically aligned with the optical waveguide relative to the top surface of the interposer, and
wherein the second substrate faces and is electrically coupled to the top surface of the interposer.

2. The MCM of claim 1, wherein the MCM includes a spacer disposed on the top surface of the interposer so that the second optical waveguide is vertically aligned with the optical waveguide.

3. The MCM of claim 2, wherein the spacer includes one of: a metal, a polymer and a resin.

4. The MCM of claim 1, wherein the optical gain chip includes an optical spot-size converter that, during operation, transitions a spot size of an optical mode in the optical waveguide to a second spot size of a second optical mode in the second optical waveguide.

5. The MCM of claim 1, wherein the photonic chip includes an optical spot-size converter that, during operation, transitions a spot size of an optical mode in the optical waveguide to a second spot size of a second optical mode in the second optical waveguide.

6. The MCM of claim 1, wherein the second substrate is a semiconductor other than silicon.

7. The MCM of claim 1, wherein the second substrate includes a III/V compound semiconductor.

8. The MCM of claim 1, wherein the optical gain chip is one of: a semiconductor optical amplifier; and a laser.

9. The MCM of claim 1, wherein the substrate, the BOX layer and the semiconductor layer constitute a silicon-on-insulator technology.

10. The MCM of claim 1, wherein the photonic chip includes an optical fiber coupler, which can optically couple to an optical fiber.

11. The MCM of claim 10, wherein the MCM includes the optical fiber optically coupled to the optical fiber coupler.

12. A system, comprising:
a processor;
a memory, coupled to the processor, which stores a program module, and which, during operation, is executed by the processor; and
an MCM, wherein the MCM includes:
a driver integrated circuit having a top surface, wherein the driver integrated circuit includes electrical circuits;
a photonic chip, wherein the photonic chip includes:
  a substrate;
  a buried-oxide (BOX) layer disposed on the substrate; and
  a semiconductor layer, wherein an optical waveguide is defined in the BOX layer and the semiconductor layer, and
wherein traces disposed on the semiconductor layer face and are electrically coupled to the top surface of the driver integrated circuit;
an interposer having a top surface, wherein the top surface of the interposer faces and is electrically coupled to the traces; and
an optical gain chip, wherein the optical gain chip includes a second substrate,
wherein a second optical waveguide is defined in the second substrate,
wherein the second optical waveguide is vertically aligned with the optical waveguide relative to the top surface of the interposer, and
wherein the second substrate faces and is electrically coupled to the top surface of the interposer.

13. The system of claim 12, wherein the MCM includes a spacer disposed on the top surface of the interposer so that the second optical waveguide is vertically aligned with the optical waveguide.

14. The system of claim 12, wherein the optical gain chip includes an optical spot-size converter that, during operation, transitions a spot size of an optical mode in the optical waveguide to a second spot size of a second optical mode in the second optical waveguide.

15. The system of claim 12, wherein the photonic chip includes an optical spot-size converter that, during operation, transitions a spot size of an optical mode in the optical waveguide to a second spot size of a second optical mode in the second optical waveguide.

16. The system of claim 12, wherein the second substrate is a semiconductor other than silicon.

17. The system of claim 12, wherein the optical gain chip is one of: a semiconductor optical amplifier; and a laser.

18. The system of claim 12, wherein the substrate, the BOX layer and the semiconductor layer constitute a silicon-on-insulator technology.

19. The system of claim 12, wherein the photonic chip includes an optical fiber coupler; and
wherein the MCM includes the optical fiber optically coupled to the optical fiber coupler.

20. A method for outputting an optical signal, comprising:
providing an electrical signal from a driver integrated circuit to a photonic chip, wherein a top surface of the driver integrated circuit faces and is electrically coupled to a trace disposed on a semiconductor layer in the photonic chip,
wherein the photonic chip includes a substrate, a buried-oxide (BOX) layer disposed on the substrate, and the semiconductor layer disposed on the BOX layer, and wherein an optical waveguide is defined in the BOX layer and the semiconductor layer;

conveying the electrical signal in the trace in the photonic chip;

providing the electrical signal from the photonic chip to an interposer, wherein a top surface of the interposer faces and is electrically coupled to the trace;

conveying the electrical signal in the interposer;

providing the electrical signal from the interposer to an optical gain chip, wherein the optical gain chip includes a second substrate that faces and is electrically coupled to the top surface of the interposer;

generating the optical signal in the optical gain chip based on the electrical signal;

conveying the optical signal in a second optical waveguide defined in the second substrate;

optically coupling the optical signal from the second optical waveguide to the optical waveguide, which is vertically aligned with the second optical waveguide relative to the top surface of the interposer; and outputting the optical signal in an optical fiber that is optically coupled to the optical waveguide.

* * * * *

UNITED STATES PATENT AND TRADEMARK OFFICE
CERTIFICATE OF CORRECTION

PATENT NO. : 9,829,626 B2  
APPLICATION NO. : 14/994976  
DATED : November 28, 2017  
INVENTOR(S) : Ivan Shubin et al.

Page 1 of 1

It is certified that error appears in the above-identified patent and that said Letters Patent is hereby corrected as shown below:

On the Title Page

Column 2, Line 2, item (56) in OTHER PUBLICATIONS please delete, "fiberes", and replace with --fibers--

In the Specification

Column 10, Line 1, please delete, "microchip", and replace with --macrochip--

Signed and Sealed this
Twentieth Day of November, 2018

Andrei Iancu
*Director of the United States Patent and Trademark Office*